United States Patent
Das et al.

(10) Patent No.: US 6,821,564 B2
(45) Date of Patent: Nov. 23, 2004

(54) PROCESS FOR MASKING TURBINE COMPONENTS DURING VAPOR PHASE DIFFUSION COATING

(75) Inventors: Nripendra Nath Das, West Chester, OH (US); Raymond William Heidorn, Fairfield, OH (US); Thomas Edward Mantkowski, Madeira, OH (US); Patricia Ann Charles, Erie, PA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/423,074

(22) Filed: Apr. 25, 2003

(65) Prior Publication Data

US 2004/0005409 A1 Jan. 8, 2004

Related U.S. Application Data

(60) Continuation of application No. 09/711,565, filed on Nov. 13, 2000, now Pat. No. 6,579,567, which is a division of application No. 09/372,106, filed on Aug. 11, 1999, now Pat. No. 6,224,673.

(51) Int. Cl.$^7$ ................................................ C23C 16/00
(52) U.S. Cl. .................... 427/248.1; 427/220; 427/221; 427/250; 427/282; 427/503; 427/504
(58) Field of Search .............................. 427/248.1, 250, 427/282; 118/220, 221, 503, 504

(56) References Cited

FOREIGN PATENT DOCUMENTS

JP          60-204879          10/1985

*Primary Examiner*—Bernard Pianalto
(74) *Attorney, Agent, or Firm*—Carmen Santa Maria; K. Scott O'Brian; McNees Wallace & Nurick LLC

(57) ABSTRACT

Apparatus and method to improve vapor phase diffusion coating of articles. The apparatus provides a barrier to segregate the portion of the article requiring coating from the portion of the article not requiring coating. The fixture is reusable, being unaffected by the coating gases. The fixture reduces the exposure of the coating gases with the portion of the article not requiring coating. By use of an optional seal, the portion of the article not requiring coating can be isolated from the coating gases.

7 Claims, 2 Drawing Sheets

PROCESS FOR MASKING TURBINE COMPONENTS DURING VAPOR PHASE DIFFUSION COATING

This application is a continuation of patent application Ser. No. 09/711,565 filed Nov. 13, 2000, now U.S. Pat. No. 6,579,567 issue Jun. 17, 2003, which is a division of patent application Ser. No. 09/372,106 filed Aug. 11, 1999, now U.S. Pat. No. 6,224,673 issued May, 1, 2001.

BACKGROUND OF THE INVENTION

1. Field of the Invention

This invention relates generally to vapor deposition apparatus and methods, and specifically to a fixture for vapor phase diffusion coating of airfoil components.

2. Discussion of the Prior Art

Turbine components such as airfoils require coatings such as aluminides for environmental protection or as bond coats. However, only a portion of the airfoil that is exposed to the hot gases of the environment requires such protection, the remainder of the airfoil not requiring such protection. Not only does the remainder of the airfoil not require such protection, coating of that portion of the airfoil is undesirable.

Turbine airfoils have an airfoil section which extend outward into the hot gases resulting from the combustion of fuel in the combustor portion of the engine. These hot gases provide the energy for operation of the engine and for thrust to propel a turbine powered vehicle. Because of the high temperatures and corrosive effects of such gases on the airfoil section, the standard practice has been to coat the airfoil portions of the turbine airfoils with protective coatings that provide insulation from the extremely high temperatures and environmental protection from the corrosive effects of the hot gases. The portion of the turbine airfoil opposite the airfoil portion is used to attach the airfoil to the disk or rotor part of the engine, which is not in the flow of hot gases and therefore is not in need of protection from heat or corrosive effects. This portion of the turbine airfoil often has the shape of a dovetail, which is assembled into dovetail slots on the disk or rotor portion of the engine. Hence, it is frequently referred to as the dovetail. The walls of the dovetail portion of the turbine airfoil contact the walls of the dovetail slots of the disk or rotor. After a long period of time or rotating at high speeds, the dovetail walls exhibit a fatigue-related phenomenon referred to as fretting. Fretting has been found to be exacerbated by coatings applied to the airfoil portion of the turbine airfoil. Thus, in order to achieve the desired properties in the various portions of the turbine airfoil to maximize the life of the turbine airfoil, it has been necessary to devise methods to properly coat the airfoil portion of the turbine airfoil without affecting the dovetail portion of the turbine airfoil.

One of the methods of providing the coating to the desired portion of the turbine airfoil has been to mask the portion of the turbine airfoil that does not require coating, that is to say, the dovetail, before inserting the turbine airfoil into a coating apparatus. Typically, two different types of masks are applied. One type of mask is a material that is inert to the metallic gases used in the coating process. A second type of mask is a material that is a getter for the metallic gases used in the coating process, that is to say, the gasses preferentially are deposited on the getter material than on adjacent exposed portions of the dovetail. Both types of masks can be applied as a coating, slurry or as a tape. The difficulty with coatings and slurries is that they can enter into cooling holes. They are difficult to remove from such passages and can block or restrict the flow of air through cooling passages causing hot spots on the turbine airfoil. They are also time-consuming to apply and are difficult to remove. The problem with tapes is that they may not be sufficiently adherent during the coating process, so that coating material can reach the turbine airfoil through seams that may open up during the coating process. Additional problems exist with gettering materials used as masks. They can become saturated and, hence, ineffective after a period of time. Additionally, because they getter the metallic vapor within the coating apparatus, additional time at a given vapor pressure or additional vapor pressure at a fixed time is required to coat the portions of the turbine airfoil that are desirably coated. Finally, if the gettering materials are not properly mixed and applied, they can react with the dovetail portion of the blades, causing the very problem they were intended to prevent.

Fixtures are used in certain applications to hold substrates as they are being coated. One such device is set forth in U.S. Pat. No. 4,485,789 to Brandolf. This patent describes an apparatus for holding a substrate as the substrate is being rotated. The substrate is rotated to provide uniform coating, as the coating method involves line of site application. Planetary motion of substrate improves coating uniformity. The device utilizes graphite bearing means between the substrate mounting head and the base support of the device to act as a sliding bearing surface between the head and the base member to prevent sticking and binding of the rotating parts, and to provide an electrical conductive path between the base support and the substrate mounting head.

What is needed is improved apparatus and method for coating turbine airfoils. The apparatus and method should permit coating application to only those portions of the airfoil requiring protective metallic coatings while protecting those portions not requiring a protective coating. Furthermore, to be effective, the improved apparatus and method must be reusable and capable of reducing the current cycle time to prepare a turbine airfoil for coating, while providing a coating at least of similar quality to coatings currently applied.

BRIEF SUMMARY OF THE INVENTION

The present invention provides a fixture and a method to improve vapor phase diffusion coating of turbine components. The fixture has general usage for coating any article in which only a portion of the article must be coated and in which a portion of the article must be masked from the coating media.

The fixture includes a barrier for segregating an interior volume of the fixture from the remaining volume of the coating apparatus or from the coating atmosphere external to the barrier. The fixture simply permits the creation of a protective environment for a portion of the article that must not be fully exposed to the coating media, thereby providing a mechanical barrier between the coating atmosphere external to the barrier and the internal volume of the fixture. The portion of the barrier that is exposed to coating atmosphere should be comprised of a material that is inert to the metallic coating vapors. Ideally, the material should have a low coefficient of thermal expansion. The barrier includes at least one aperture of a preselected configuration. The configuration of the aperture should be substantially the same as a cross section of the article that is to be coated, but slightly larger. This size and configuration permits the article to be coated to be readily inserted into the fixture, with the cross section of the article itself forming part of the boundary or barrier between the internal volume of the fixture and the coating atmosphere, the portion of the article forming a part of the boundary having a portion of at least one surface facing inward, bounding the internal volume and not exposed to the coating atmosphere, and a portion of at least one surface facing outward and exposed to the coating atmosphere.

The internal volume also may include a holder to support at least one article, such as a turbine component. The sole purpose of the holder is to provide stability to the article undergoing coating during the coating operation. This may be an elaborate fixture designed to clamp and hold the article, or it may simply be a ledge that the article may rest upon. However, once assembled into the fixture so that the article is held by the article holder, the portion of the article that is to be coated projects outwardly from the fixture so that the portion of the article that is not to be coated lies within the internal volume of the fixture, the interior volume of the fixture being defined to include that portion of the fixture, upon assembly of an article for coating, not otherwise exposed to the coating atmosphere.

Because the aperture is designed to be slightly larger than a cross section of the article so that the article, such as a turbine airfoil, can be easily and readily assembled into it, small gaps will exist in the aperture at the interface between the article assembled into the fixture and the fixture itself. These small gaps may allow for the seepage of some coating material into the interior of the fixture. For many applications, the reduced seepage may provide for an adequate reduction in the amount of coating material deposited on the portion of the turbine component within the interior of the fixture. However, certain applications may require no deposit of coating material onto the turbine component. In these cases, the gaps must be sealed. In order to provide an effective seal to prevent the leakage of coating media through these gaps and into the interior volume of the fixture, means for sealing these regions of the aperture, the small gaps, between the article, now assembled into the article holder, and the fixture walls forming the barrier, may be applied. The means for sealing provide a positive seal between the internal volume of the fixture and volume external to the fixture, so that there is no leakage of coating into the internal volume of the fixture and deposition onto the article in that region. In this manner, an effective seal can be formed so that only the portions of the article external to the fixture are exposed to the coating media.

An advantage of the present invention is that the apparatus and method of the present invention expose only those portions of the article requiring protective metallic coatings to the coating media, reducing the exposure of other portions of the article to the coating media, or alternatively sealing those portions not requiring a coating completely from exposure to the coating media.

Another advantage of the present invention is that the fixture and method are reusable. Although the fixture requires special design to accommodate an article, the article is readily assembled into the fixture and a means for sealing is easily applied. Thus, the use of this fixture reduces the current cycle time required to prepare an article such as a turbine airfoil for coating.

Because the fixture is made from a material that is inert to metallic materials, it has the added advantage of a particularly long life, since coating media will not be deposited on its exterior surfaces, unlike prior art metallic fixtures which are not only subject to undesirable coating build-up, but also to distortion and cracking.

The present invention also eliminates the need to apply a masking material to the article. Not only is the application of such masking material time-consuming, but for articles having intricate small, detailed features, such as cooling holes in turbine airfoils, the use of such masking material tends to clog, block or restrict the openings which can negatively impact the purposes of such features. The present invention advantageously eliminates the use of masking materials, providing a positive seal to prevent exposure of portions of the article from the coating media without the use of materials which may otherwise adversely affect fine features of the article.

Improvements in manufacturing technology such as described above are the keys to increased performance and reduced costs for many articles. As an example, continuing and often interrelated improvements in processes and methods have resulted in improved efficiency in the both the repair of gas turbine engines as well as in the manufacture of new components for gas turbine engines.

Other features and advantages of the present invention will be apparent from the following more detailed description of the preferred embodiment, taken in conjunction with the accompanying drawings which illustrate, by way of example, the principles of the invention.

Whenever possible, the same reference numbers will be used throughout the figures to refer to the same parts.

DETAILED DESCRIPTION OF THE INVENTION

The present invention provides a fixture for holding a turbine component such as an airfoil during high temperature coating operations. The fixture is used while the turbine component is undergoing a coating operation so that only those portions of the component undergoing the coating operation are fully exposed to the coating material, the remaining portions of the turbine component having minimal or no exposure to the coating atmosphere. The fixture can be partially or completely non-metallic in construction. The fixture can have a coefficient of thermal expansion which is relatively lower than the coefficient of thermal expansion of the held component.

Figure 1:
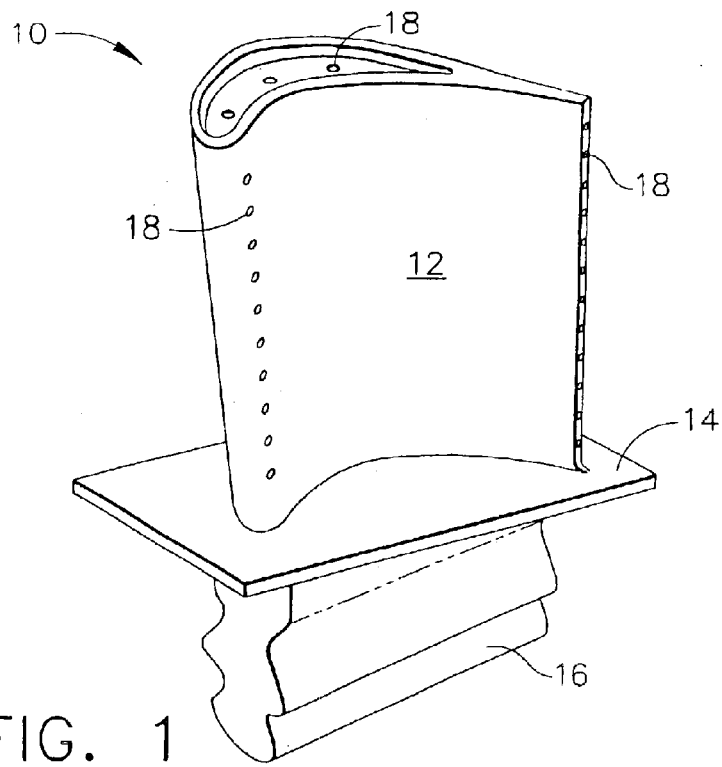
FIG. 1 is a perspective view of an airfoil.

Referring now to FIG. 1, a turbine component that requires coating of only a portion of its surface is depicted. A turbine airfoil 10 having an airfoil portion 12, a blade platform portion 14 and a dovetail portion 16 is made of a high temperature superalloy such as Rene N5. Although not all turbine components may be identical to the airfoil blade of FIG. 1, the turbine components for which the present invention provides a significant advantage share similar characteristics to airfoil 10 in that a portion of the component requires coating while a portion of the coating should not be coated, or if coated, should have a minimal amount of coating material deposited thereon. Referring again to FIG. 1, turbine airfoil 10 requires coating of the airfoil portion 12. However, dovetail portion 16 should not be coated. Airfoil portion 12 generally is positioned within the hot gases that are produced by the combustor of the gas turbine engine. Thus, airfoil portion 12 is subjected to a hot flow of corrosive, oxidative gases that impinge airfoil portion 12 at temperatures typically in excess of 2400° F. It is therefore very important for airfoil portion 12 not only to be coated with materials that protect it form this harsh environment, but it is also important that the cooling system which provides cooling air remains effective during operation. Thus, a consideration in processing of turbine components such as airfoil 10 is that cooling holes 18 forming an important part of the cooling system are not adversely affected by processing. Dovetail portion 16, on the other hand, should not be coated. Dovetail portion 16 is precision machined to fit within dovetail slots located on rotor or disk assemblies. Because of the precision machining, the addition of even small amounts of coating can adversely affect the tight tolerances of the dovetails, causing assembly problems. In addition, the rotor assemblies rotate at very high speeds. Even when the coating does not interfere with the assembly of airfoils 10 into disk slots, the interfaces between the dovetail portions 16 and dovetail slots are adversely affected by the presence of coating materials typically used for protection of the airfoil portions causing premature fatigue problems with the dovetail portion 16 and the mating dovetail slot of the disk. This fretting phenomenon is well-known in the art and various steps are taken to avoid it.

In order to protect portions of the turbine component from the coating operations, specially designed fixtures have been used, when possible, to shield or minimize the exposure of the component to coating materials. The problem with these fixtures is that they are typically made from metallic materials in order to withstand the high temperatures. These fixtures are adversely affected by the repeated exposure of the fixture to the coating material, resulting in a shortened fixture life. Alternatively, in order to protect certain portions of the component from exposure to the coating materials, the portions that are not to be coated are masked. A gas turbine will contain up to eighty airfoils in one stage, such as airfoil 10 depicted in FIG. 1 in one stage, and may contain up to five different stages. Thus, the masking of even small portions of turbine components can be time consuming and expensive.

Figure 2:
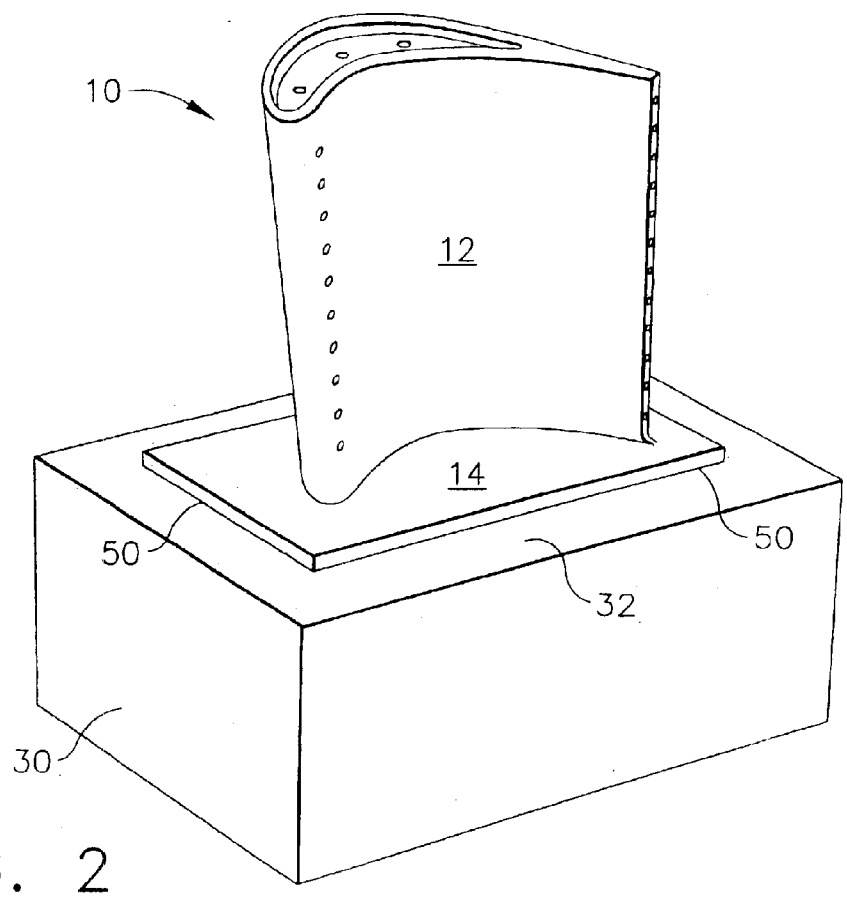
FIG. 2 is a perspective of the fixture of the present invention with an airfoil assembled therein.

The fixture of the present invention eliminates or reduces these common problems. Referring now to FIG. 2, airfoil 10 is shown assembled into fixture 30 so that airfoil portion 12 extends outward from fixture 30. Dovetail portion, not shown in FIG. 2, extends downward into an aperture, not shown in FIG. 2, of fixture 30. Platform portion 14 rests on top surface 32 of fixture 30. Once airfoil 10 is assembled into fixture 30, means 50 for sealing the interface between top surface 32 of fixture 30 and platform portion 14 of airfoil 10 is optionally applied to prevent coating gases from depositing on dovetail portion. Fixture 30 having airfoil 10 sealed by optional sealing means 50 is placed in a coating device and coating is applied to airfoil portion 12 to the desired thickness.

Figure 3:
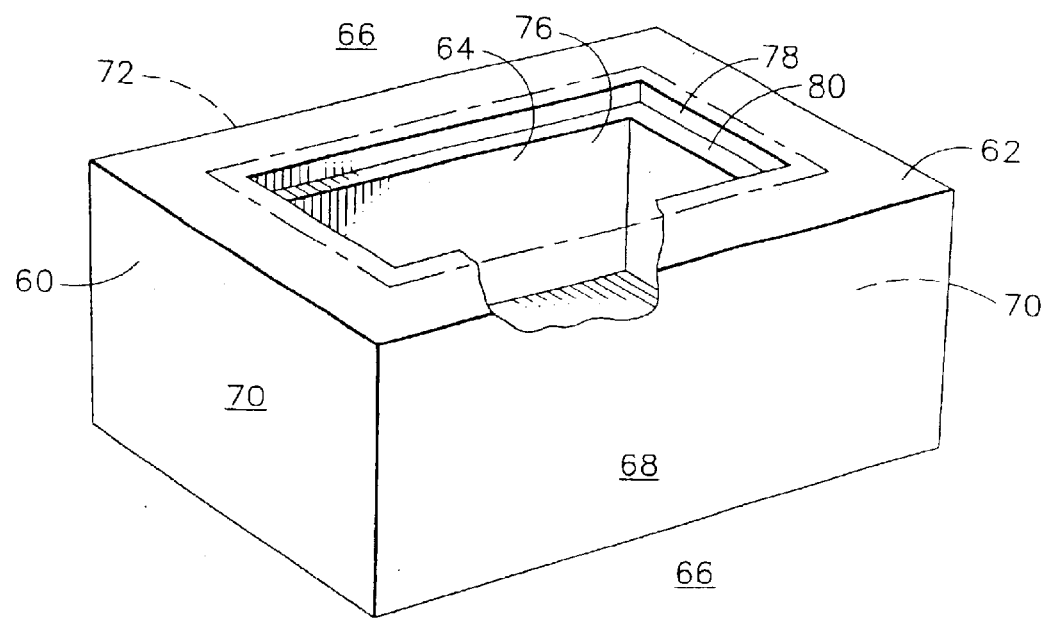
FIG. 3 is a perspective view of one embodiment of the fixture of the present invention without an airfoil assembled therein, providing access into the interior of the fixture.

Referring now to FIG. 3 in conjunction with FIG. 2, fixture 60 depicts one embodiment of the fixture of the present invention. Like fixture 30 in FIG. 2, fixture 60 forms a barrier for segregating an internal volume 64 of fixture 60 from the volume 66 external to fixture 60. Fixture 60 is depicted as a box, but may assume any convenient shape for holding the turbine component that is to be coated. Fixture 60 has an external portion that is exposed to the coating material which may be in the form of a gas vapor, spray or highly energized stream. The external portion is comprised of a material that is inert to the metallic gas coating vapors. Preferably, the external portion is also made from a material having a low coefficient of thermal expansion. The external portion of fixture 60 includes a top surface 62, a front surface 68, a pair of side surfaces 70, a back surface 72 and a bottom surface 74. An aperture 76 designed to accept a turbine component such as the airfoil of FIG. 1 extends through at least one of the surfaces, surface 62 of FIG. 3. Within aperture 76 are walls 78 forming boundaries for the interior portion of fixture 60. Aperture may extend completely through fixture 60, resulting in an opening along the opposite surface, bottom surface 74 of FIG. 3. This can be accomplished if the floor of the coating device when bottom surface 74 is placed thereon provides adequate protection from entry of coating material, typically when the coating material is an energized stream or spray. Alternatively, sealing means can be applied to the bottom surface 74 of fixture 60 or to the floor of the coating device. Preferably, aperture 76 does not extend completely through fixture 60 from one surface, top surface 62 in FIG. 3, to an opposite surface. In the embodiment shown in FIG. 3, a ledge 80 projects outwardly from walls 78. Platform portion 14 of airfoil 10 conveniently can be assembled onto ledge 80. Sealing means can be pre-placed onto ledge 80 so that airfoil 10 can be pressed onto sealing means. Alternatively, sealing means can be applied around the perimeter of platform portion 14 and either of ledge 80, walls 78 or top surface 62 depending upon the planned fit-up of turbine component into fixture 60.

Figure 4:
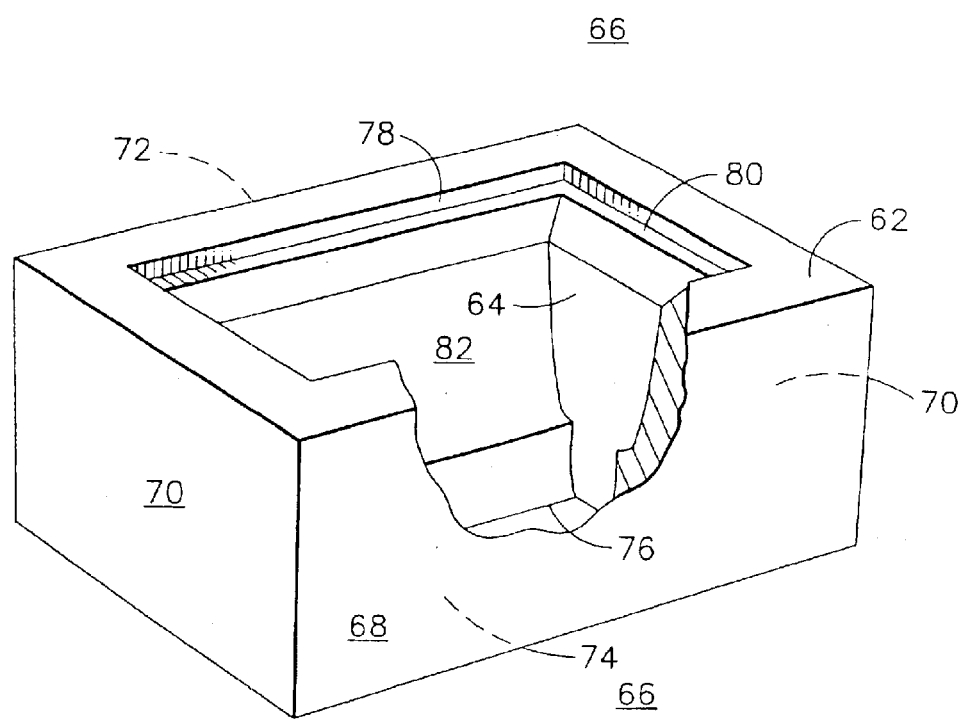
FIG. 4 is a perspective of a second embodiment of the present invention having an interior dovetail holder with no airfoil assembled therein.

Referring now to FIG. 4, an alternate embodiment of fixture 60 is shown. This embodiment includes a holder for the turbine component to firmly position the turbine component within fixture 60 so that the component cannot easily shift and be damaged during movement into or out of the coating device, or during the coating operation. The holder can vary, such as in shape, depending upon the turbine component undergoing the coating. In FIG. 4, Fixture 60 additionally includes, as a holder for an airfoil 10, a dovetail slot 82. The dovetail slot 82 accepts the dovetail portion 16 of the airfoil. Such holders are optional features providing additional stability to turbine components that may otherwise be mechanically metastable when assembled into the fixture.

As noted previously, the fixture should form a barrier, while also being comprised of a material that is inert to the metallic coating materials. Preferably, the material should have a low coefficient of thermal expansion. Metallic materials that could be used for fabrication of the fixtures, although currently expensive, include commercially pure refractory metals such as molybdenum and tungsten. In one embodiment, the material is non-metallic. One such material that has been particularly effective is graphite. A fixture made from graphite is very lightweight. It has a low coefficient of thermal expansion and is substantially inert to coating material. Upon removal of a graphite fixture from a coating operation, there is no coating buildup on the fixture. In fact, any coating material that may have been deposited on the fixture can be wiped off or lightly brushed off. Such a fixture can be reused for coating operations for multiple cycles without any adverse effects. Low coefficients of thermal expansion are desirable. Fixtures having such low coefficients of thermal expansion can be used to reduce or prevent the effects of coating even when a sealing means is not used to seal the internal volume of the fixture from the volume external to the fixture. The turbine components that require coating as noted previously are typically superalloys that have coefficients of thermal expansion that are greater than that of the fixture of the present invention. The fixture of the present invention can comprise a nonmetallic material. For example, the fixture may be partially or completely constructed of graphite or a ceramic material, including but not limited to aluminum silicate, silicon carbide, graphite composite, ceramic matrix composite, oxide-oxide composite carbon-carbon composites, and combinations thereof. For a fixture that has been properly sized, the turbine components may be readily fitted into the fixture. Upon heating to the coating temperature, which coating temperature may vary from about 1800–2100° F., depending upon the desired coating results, the metallic superalloy turbine component will expand at a greater rate than will the fixture, and any openings that exist between the turbine component and the fixture will be reduced, resulting in reduced accessibility for the coating gasses into the internal volume of the fixture. However, if the component is fitted into the fixture and not enough tolerance is provided to allow for expansion of the turbine component during heating, the turbine component could damage the fixture. Under ideal circumstances, by use of an exactly sized opening and a precisely machined turbine component at the appropriate temperature, it is possible to achieve a complete seal without the use of sealing means. However, this is unlikely and if it occurs, is most likely to be as a result of chance, because the fixtures will be machined to accommodate the greatest allowable mismatch between the fixture and the turbine components, as the fixtures will be used repeatedly on turbine components of various sizes. If this mismatch is not provided for, then some of the fixtures will be damaged and will have a shortened life as set forth above. If a complete seal rather than reduced accessibility is desired, this can best be accomplished by using a small amount of sealing means between the fixture and the turbine component. This reduces the possibilities of stress-induced cracks that can shorten the life of the fixture. A metallic fixture that is coated with a high temperature nonstick material, such as graphite, may be used. While such a coated device will certainly result in an increase in life over an uncoated metallic fixture, it is expected that the coated material would peel, spall or flake off due to the differential in the coefficient of thermal expansion between the coating and the underlying metal. If the coating can be applied cheaply and quickly, then the spalling is not a concern as the fixtures could be refurbished. However, most of the available methods of coating metal are neither cheap nor quick. A coating such as is applied to turbine blades is a consideration, but is currently expensive.

While graphite is the preferred material of construction, other suitable materials that exhibit similar characteristics include carbon-reinforced composites as well as ceramic composites such as oxide-oxide composites or silicon carbide.

The means for sealing can be any material that can provide a positive seal between the internal volume of the fixture and the volume external to the fixture. The material should be flexible or capable of forming a gasket. The material used for sealing must be impervious to the coating material, that is to say, it must not permit substantial amounts of coating material to pass across it during the coating operation. Furthermore, the material must retain its sealing properties at the elevated temperatures at which coating is performed. It must not degrade or adversely affect the coating operation. Furthermore, it should be readily removable at the completion of the coating operation. One acceptable material is a high temperature deformable metallic foil, such as a nickel foil or a ferrous foil such as stainless steel foil or other iron or steel foil. This foil is disposable at the completion of each coating cycle, is readily available and is inexpensive. Among the acceptable tapes or thin sheets are graphite or ceramic powders and metal powder mixed with about 8 to about 10% by weight of an organic binder. Another sealing material is a putty that includes a metal powder, metal oxide powder, ceramic powder or graphite powder or mixtures thereof. Although any suitable powder mixture can be used, some powder mixtures that have been found to be acceptable include at least about one percent (1%) by weight of a metal powder such as nickel and at least about sixty five percent (65%) by weight of an inert powder such as aluminum oxide powder, nickel oxide powder or chrome oxide powder and mixtures thereof. The powder mixture desirably can withstand coating temperatures in the range of about 1750–2100° F. The powder mixture can be mixed with about 15% of an organic binder. The organic binders preferably are water-based, acrylic or acrylic-based. Of course, water or any volatile constituents such as volatile carbon compounds that include, among other carbon compounds, alcohol, glycerin or tetrafluoroethylene included in the organic binders will be driven out at the elevated temperatures of the coating operation, leaving behind substantially the metal, ceramic or graphite material to form the seal. To be functional, the putty must be formable so as to fill any gaps or openings between the turbine components and the fixture after they are assembled together.

Although the present invention has been described in connection with specific examples and embodiments, those skilled in the art will recognize that the present invention is capable of other variations and modifications within its scope. These examples and embodiments are intended as typical of, rather than in any way limiting on, the scope of the present invention as presented in the appended claims.

What is claimed is:

1. A method for vapor phase diffusion coating turbine component, comprised of the steps of:

providing a fixture including at least one aperture of preselected configuration for receiving the turbine component having a coefficient of thermal expansion greater than that of the fixture, the aperture providing communication between the internal volume of the fixture and the volume external to the fixture, and having a configuration corresponding to a preselected cross section of the turbine component, the aperture being sized so that openings between the component when assembled to the fixture and the fixture are reduced as a result of differential thermal expansion between the fixture and the component during heating to coating temperatures above about 1800° F., thereby reducing the flow of coating gases into the internal volume;

providing at least one turbine component holder positioned within the interior volume of the fixture and accessible through the aperture, assembling at least one turbine component into the holder within the fixture through the aperture so that the turbine component is supported by the holder, a portion of the turbine component being positioned within the interior volume of the fixture and a portion of the turbine component extending outward from the fixture;

placing the assembly into a coating apparatus;

heating the assembly to an elevated temperature, the heating causing differential thermal expansion between the turbine component and the fixture, the differential thermal expansion between the fixture and the component so that openings between the component and the fixture at the aperture are reduced, but not eliminated, thereby restricting gas flow into the internal volume of the fixture;

introducing coating gases into the coating apparatus to form a coating on the portion of the turbine component extending outward from the fixture; and cooling the assembly and removing the assembly from the coating apparatus.

2. A method of coating a component, comprising the steps of:

providing a fixture having an internal volume, at least a portion of the fixture formed of a material having a lower coefficient of thermal expansion than the coefficient of thermal expansion of at least a portion of the component;

positioning the component to be coated relative to the fixture such that a portion of the component not to be coated is disposed within the internal volume of the fixture and a portion of the component to be coated is external to the fixture;

heating the component assembled to the fixture to an elevated temperature, wherein the clearance between the fixture and a portion of the component is reduced, but not eliminated, as a result of differential thermal expansion between the fixture and the component; and exposing the component assembled to the fixture to a coating gas, the reduced clearance between the component and the fixture reducing a flow of coating gas into the internal volume of the fixture.

3. The method of claim 2 wherein the step of providing the fixture comprises providing a fixture having a surface for supporting the component to be coated.

4. The method of claim 2 wherein the fixture comprises graphite.

5. The method of claim 2 wherein the fixture comprises a carbon-reinforced composite.

6. The method of claim 2 wherein the fixture comprises a ceramic matrix composite.

7. The method of laim 2 wherein the fixture comprises silicon carbide.

\* \* \* \* \*

UNITED STATES PATENT AND TRADEMARK OFFICE
CERTIFICATE OF CORRECTION

PATENT NO. : 6,821,564 B2
DATED : November 23, 2004
INVENTOR(S) : Das et al.

It is certified that error appears in the above-identified patent and that said Letters Patent is hereby corrected as shown below:

Column 1,
Line 1, "continuation of patent" should be -- continuation of pending patent --.
Line 3, "issue" should be -- issued --.

Column 8,
Line 37, "coating turbine" should be -- coating a turbine --.
Line 51, "1800ºF.," should be -- 1800ºF, --.
Line 57, "aperture," should be -- aperture; --.

Column 10,
Line 20, "laim" should be -- claim --.

Signed and Sealed this

Fourth Day of October, 2005

JON W. DUDAS
*Director of the United States Patent and Trademark Office*